United States Patent [19]

Ogawa

[11] Patent Number: 5,015,559
[45] Date of Patent: May 14, 1991

[54] PROCESS FOR FORMING A FINE RESIST PATTERN

[75] Inventor: Kazufumi Ogawa, Hirakata, Japan

[73] Assignee: Matsushita Electric Industrial Co., Ltd., Osaka, Japan

[21] Appl. No.: 379,864

[22] Filed: Jul. 14, 1989

[30] Foreign Application Priority Data

Jul. 26, 1988 [JP] Japan ................... 63-185970

[51] Int. Cl.$^5$ ................ G03F 7/32; G03F 7/40
[52] U.S. Cl. .................... 430/326; 430/270;
430/192; 430/325; 430/328
[58] Field of Search ........... 430/192, 270, 325, 328, 430/326

[56] References Cited

U.S. PATENT DOCUMENTS 4,810,601 3/1989 Allen et al. ................ 430/18

Primary Examiner—Charles L. Bowers, Jr.
Assistant Examiner—Ashley Pezzner
Attorney, Agent, or Firm—Stevens, Davis, Miller & Mosher

[57] ABSTRACT

A process for forming a fine resist pattern which comprises forming an organic thin film by coating a substrate with a resist comprising, as a base polymer, a polymer to which there is chemically bonded a functional group which is converted into amino group or sulfonic acid group responding to a first energy beam; forming a surface exposed patterned layer at the vicinity of the surface of the organic thin film by selectively exposing said surface to said first energy beam; selectively staining said surface exposed patterned layer with a substance which absorbs a second energy beam; exposing the entire surface of said organic thin film to said second energy beam and forming a resist pattern by developing the organic thin film exposed to said second energy beam. According to the process of the present invention, a fine resist pattern of a high resolution can be obtained using an exposure apparatus of a shallow focal depth without largely improving the conventional resist process technology.

8 Claims, 3 Drawing Sheets

PROCESS FOR FORMING A FINE RESIST PATTERN

BACKGROUND OF THE INVENTION

1. Field of the Invention

The present invention relates to a process for forming a fine resist pattern and more particularly to a novel and simple process for forming a fine resist pattern in a photolithographic technology.

2. Description of Related Art

The recent advancement in a semiconductor device manufacturing technology has given rise to a demand for a photolithographic technology for forming a superfine pattern in the order of 0.5 $\mu$m. As to a technology for forming a superfine pattern in the order of 0.5 $\mu$m or even smaller, in the aspect of apparatus, there have been made the studies of techniques for shortening the wavelength of the conventional stepper and widening the numerical aperture thereof. Besides, as new apparatuses for forming superfine patterns, there are being developed an excimer laser stepper, an X-ray stepper and a direct writing type electron beam exposure apparatus.

There is, however, a definite limit to the widening of numerical aperture and the shortening of wavelength of the conventional stepper; the fabrication of a mask for an X-ray stepper is difficult and a throughput is low in a direct writing type electron beam exposure apparatus. Because of these reasons, an excimer laser stepper is presently considered to be the most hopeful one. The excimer laser stepper, however, has its own demerits. That is, as expressed in the following Reyleigh's equation (1):

$$R = k\lambda/NA \quad (1)$$

wherein R is a resolution, k is a constant (from 0.6 to 0.8), $\lambda$ is an exposure wavelength and NA is a numerical aperture of lens, the value of NA must be increased in order to improve the resolution without changing the wavelength of a stepper, but a focal depth (FD) becomes shallower as shown in the following equation (2):

$$FD = \lambda/(NA)^2 \quad (2)$$

when the value of NA is increased.

On the other hand, various methods have been proposed and attempted in a resist process technology, too. For example, there are known a multilayer resist method (MLR method), an antireflective coating method (ARC method), a contrast enhanced lithography method (CEL method), a portable conformable mask method (PCM method), an image reversal method (IR method) and the like. Although these methods are effective to compensate for the shallow focal depth in the photolithographic technology, they are not very practical because their processes are complicated or because the effect of increasing focal depth is not sufficient.

Therefore, the conventional resist process technology is not enough to cope with the shallow focal depth accompanied by the shortening of wavelength and the widening of numerical aperture in an excimer laser stepper.

Also, the present inventor has proposed in U.S. application Ser. No. 159,294 a process for forming a pattern which comprises forming an exposed layer by selectively irradiating the surface of an applied resist with a first energy beam; allowing a substance (dyestuff) which absorbs a second energy beam to adhere to the exposed layer; exposing the whole surface of the applied resist with the second energy beam and removing the portion of the resist where the exposed layer is not formed, by developing the resist. Hereinafter, this process is referred to as a Dye Image Reversal method (DIR method).

In the above-mentioned U.S. application Ser. No. 159,294, for example, there is disclosed the example using a resist comprising a novolak-type resin and a naphthoquinone diazide-type photosensitizer. Since, however, the naphthoquinone diazide-type photosensitizer is converted into indene carboxylic acid by the exposure with the first energy beam in a novolak-type resin, the converted photosensitizer is eluted and hence the surface of the applied resist becomes rough when the exposed layer is dyed by an alkaline dyestuff. The roughness of the surface is a disadvantage of forming a fine resist pattern.

SUMMARY OF THE INVENTION

The present inventor has investigated a resist process technology capable of fully exhibiting the performance of an exposure apparatus of a shallow focal depth such as an excimer laser stepper in order to solve the above-mentioned problems of the conventional resist process. As a result, he has found a novel process for forming a fine resist pattern which uses, as a base polymer, a polymer to which there is chemically bonded a functional group which is converted into amino group or sulfonic acid group responding to an energy beam.

An object of the present invention is to provide a process for producing a fine resist pattern which is capable of fully exhibiting the performance of an exposure apparatus of a shallow focal depth.

Another object of the invention is to provide a process for forming a fine resist pattern which exhibits the same advantage to the fine pattern forming even with a monolayer resist as with a bilayer resist.

Further another object is to provide an improved process for forming a fine and precise resist pattern which causes no roughness of the surface of an applied resist even if the surface is subjected to exposing and dyeing.

Other objects and advantages of the invention will become apparent from the following description.

The present invention relates to a process for forming a fine resist pattern which comprises forming an organic thin film by coating a substrate with a resist comprising, as a base polymer, a polymer to which there is chemically bonded a functional group which is converted into amino group or sulfonic acid group responding to a first energy beam; forming a surface exposed patterned layer at the vicinity of the surface of the organic thin film by selectively exposing said surface to said first energy beam; selectively staining said surface exposed layer with a substance which absorbs a second energy beam; exposing the entire surface of said organic thin film to said second energy beam and forming a resist pattern by developing the organic thin film exposed to said second energy beam.

Figure 1:
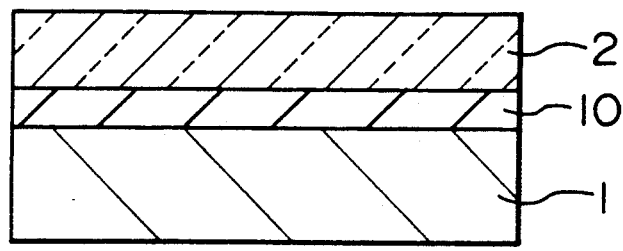
FIGS. 1-5 are sectional views for explaining the process of the present invention, FIG. 6 (a) and (b) are the UV-VIS spectrum of a resist before being exposed to a first energy beam and that of the resist after being dyed by a dyestuff, respectively.

1 ... silicon wafer, 2 ... organic thin film (positive resist), 3 ... first energy beam (deep ultraviolet light), 4 ... second energy beam (ultraviolet light), 5 ... resist pattern, 10 ... $SiO_2$ layer, 20 ... surface exposed patterned layer, 30 ... dyed layer, 100 ... mask, 200 ... undyed portion.

PREFERRED EMBODIMENT OF THE INVENTION

A first energy beam in the present invention is used in order to expose first a resist applied on a substrate through a mask, and specifically includes a deep ultraviolet light such as a KrF excimer laser, an ultraviolet light, X-ray, electron beam, ion beam or the like.

A functional group which is converted into amino group or sulfonic acid group responding to the first energy beam specifically includes groups represented by the following formulae (i), (ii) and the like:

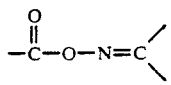

(i)

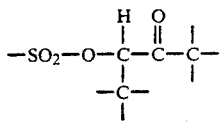

(ii)

and, however, is not restricted to these examples. Hereinafter, the above-mentioned functional group is referred to as the photosensitive group, and the polymer to which the photosensitive group is chemically bonded is referred to as the photosensitive polymer.

The type of the first energy beam depends upon the type of the photosensitive polymer.

The photosensitive groups represented by the formulae (i) and (ii) are converted into amino group ($-NH_2$) and sulfonic acid group ($-SO_3H$), respectively, each responding to a proper first energy beam.

A substrate used in the present invention is the one used in the ordinary semiconductor device manufacture, and includes, for example, semiconductor wafers such as a silicon wafer on which a $SiO_2$ layer is formed and the like.

A resist comprising a photosensitive polymer as a base polymer may contains a photosensitizer such as a compound having naphthoquinonediazide structure or the like, and/or a photoinitiator such as benzophenone or the like.

According to the present invention, an organic thin film formed by coating a substrate with the resist is exposed selectively, for example, in the form of a pattern of the order of 1 μm or less, through a mask to the first energy beam for a short period. Since the base polymer contained by the resist absorbs most of a deep ultraviolet light for example, the organic thin film is exposed selectively only at the vicinity of the surface thereof to form an extremely thin surface exposed patterned layer even if it is exposed a little excessively. Therefore, the above-mentioned step has the same effect as an MLR method, wherein some thin resist layers form a multilayer and only the top resist layer is selectively exposed.

Accordingly, there can be used an exposure apparatus of a shallow focal depth and high resolution such as an excimer laser stepper of a focal depth of about 1.5 μm, or the like.

In the surface exposed patterned layer, amino group or sulfonic acid group is formed by a photoreaction.

For example, when there is used a resist consisting of a photosensitive polymer represented by the formula (iii):

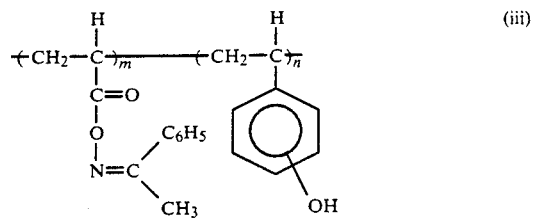

(iii)

wherein m and n each represent an integer independently; a photosensitizer having a naphthoquinonediazide structure and benzophenone as a photoinitiator, the photosensitive group is converted into amino group by the following photoreaction:

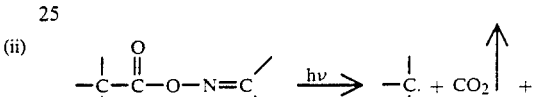

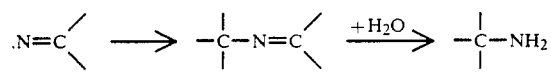

Also, for example, when there is used a resist consisting of a photosensitive polymer represented by the formula (iv):

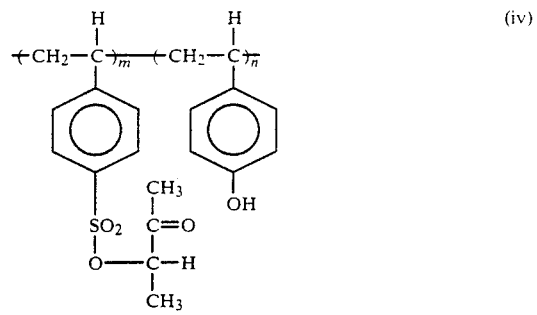

(iv)

wherein m and n each are an integer independently, and a photosensitizer having a naphthoquinonediazide structure, the photosensitive group is decomposed into sulfonic acid group ($-SO_3H$) and

by a photoreaction.

Next, the surface exposed patterned layer which has been exposed selectively to the first energy beam is stained with a substance such as a dyestuff or the like which absorbs a second energy beam (hereinafter such a substance is merely referred to as the substance). The substance includes any of materials which specifically stain a portion containing amino group or sulfonic acid group formed by irradiation with the first energy beam. In the case of amino group, the substance may be an acidic dyestuff such as Basic Red, Kaynol Yellow 3RL (each made by NIPOON KAYAKU CO., LTD.), Ciba Chlorane Blue 89 (made by CIBA-GEIGY) or the like. Thereby, a portion containing amino group is dyed red, yellow, blue or the like, respectively. In the case of sulfonic acid group, the substance may be an alkaline dyestuff such as Fuchsine, Auramine or the like.

The substance is not limited to a dyestuff as far as it can absorb the light of a second energy beam and stain specifically the surface exposed patterned layer exposed to the first energy beam.

A second energy beam has a large transmittance to a resist and is selected depending upon the type of photosensitive polymer, photosensitizer or the substance. The second energy beam includes an ultraviolet light such as g-line, i-line or the like, visible rays, X-ray, soft X-ray and the like.

The wavelength of the second energy beam is usually longer than that of the first energy beam and, however, may be the same as or shorter than that of the first energy beam depending upon a photosensitizer.

For example, when an ultraviolet light is used as the first energy beam and a reagent containing a heavy metal such as Pb, Au or the like is used instead of a dyestuff as the substance, X-ray generated by synchrotron orbital radiation is used as the second energy beam.

Since, in the present invention, the photosensitive group is chemically bonded directly to a base polymer in a resist, there does not occur the elution of a photosensitive material or the roughness of the surface when the substance stains the surface exposed patterned layer exposed to the first energy beam.

Next, the whole surface of the organic thin film which has been selectively exposed to the first energy beam is irradiated with a second energy beam. The second energy beam is absorbed by the portion being stained by the substance and therefore does not reach the lower portion thereunder. Therefore, the portion not being stained by the substance is only exposed selectively to the second energy beam. That is to say, the abovementioned steps have the same effects as a CEL method, a PCM method and an IR method at the same time.

Finally, the portion not being stained by the substance is removed selectively by developing the organic thin film with a resist developer. Thereby can be obtained a high resolution resist pattern which reverses a mask pattern in the same way as by an IR method. In the above-mentioned examples, the substance stains only an exposed portion. In contrast, however, even if the substance specifically stains an unexposed portion, the same effect as above can be obtained, except that a resist pattern is reversed.

The process for forming a resist pattern of the present invention has the advantages of a MLR, CEL, PCM and IR method.

According to the present invention, since quite a thin layer at the vicinity of the surface of the organic thin layer is exposed to a first energy beam, the advantage of an MLR method is utilized. Also, by staining a selectively exposed portion, the contact mask effect of a CEL method. That is, the stained portion serves as a mask sticking fast to the organic thin film of the resist and thereby, a high resolution is obtained. Further, the advantage of a PCM method is utilized by selectively forming a light absorption pattern on the resist. Further also, the effect of an IR method is utilized by forming a positive resist pattern.

The process of the present invention also has advantages that the above-mentioned methods do not have.

The process of the present invention requires only one coating step and developing step, and therefore is greatly simplified as compared with the conventional MLR method. Also, since the process of the present invention requires no heating step, its process stability is excellent as compared with the conventional IR method. Further also, since there is no light blanched film on a resist in the process of the present invention unlike a CEL method, an exposure time is notably shortened and a contrast is sufficient, and only one step of coating is enough. Since, in the process of the present invention, only the vicinity of the surface of the organic thin film is exposed and the exposure light does not reach the lower part thereunder, there is no reflection from the substrate surface and thereby, a pattern resolution is greatly enhanced as compared with an ARC method. Since, in the process of the present invention, a light absorption layer in the form of a pattern of high contrast can be formed without coating a substrate in two layers, a resolution is dramatically enhanced.

The present invention is explained more specifically below referring to the Examples. However, the present invention should not be construed to be restricted to the Examples.

EXAMPLE 1

As shown in FIG. 1, the silicon wafer 1 on which a SiO$_2$ layer 10 had been formed was coated in a thickness of 1.5 μm with a positive resist obtained by dissolving the base polymer the repeating unit of which was represented by the following formula:

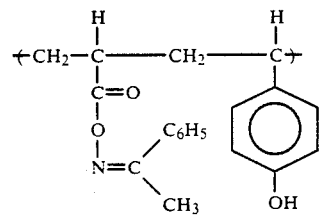

and, as a photosensitizer, the compound of the following formula:

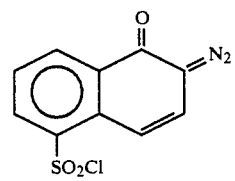

at a ratio of 8:2 and 10% by weight based on the photosensitizer of benzophenone in dichloroethane, in order to form an organic thin film 2 on the silicon wafer.

Figure 2:
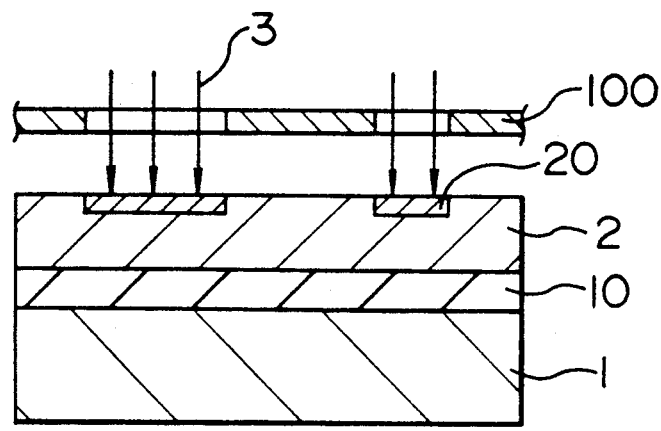

The organic thin film was exposed to a deep ultraviolet light 3 (KrF excimer laser light) used as a first exposure light through a mask 100 at a dose of 100 mJ/cm$^2$, using an excimer laser stepper, as shown in FIG. 2. Thereby, only the vicinity of the surface of the organic thin film 2 was exposed selectively, that is, in the form of a pattern having a line width of 1 μm. Since the base polymer in the resist absorbed most of the deep ultraviolet light, only the surface layer of 0.1 μm in thickness was exposed in the form of the mask pattern to form a surface exposed patterned layer 20 having 0.5 μm in width on the organic thin film, even if a little excess exposure was conducted.

In the surface exposed patterned layer, amino group was formed from

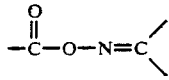

group existing in the base polymer by the first energy beam.

Figure 3:
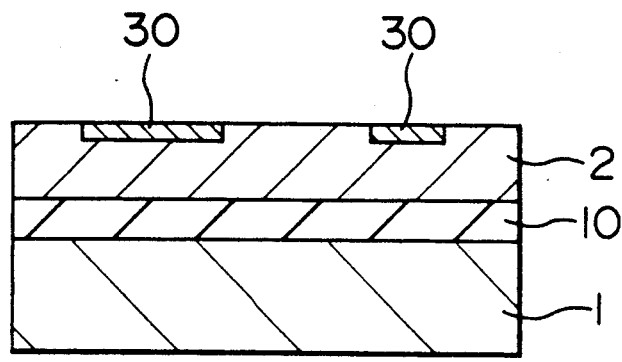
Figure 6:
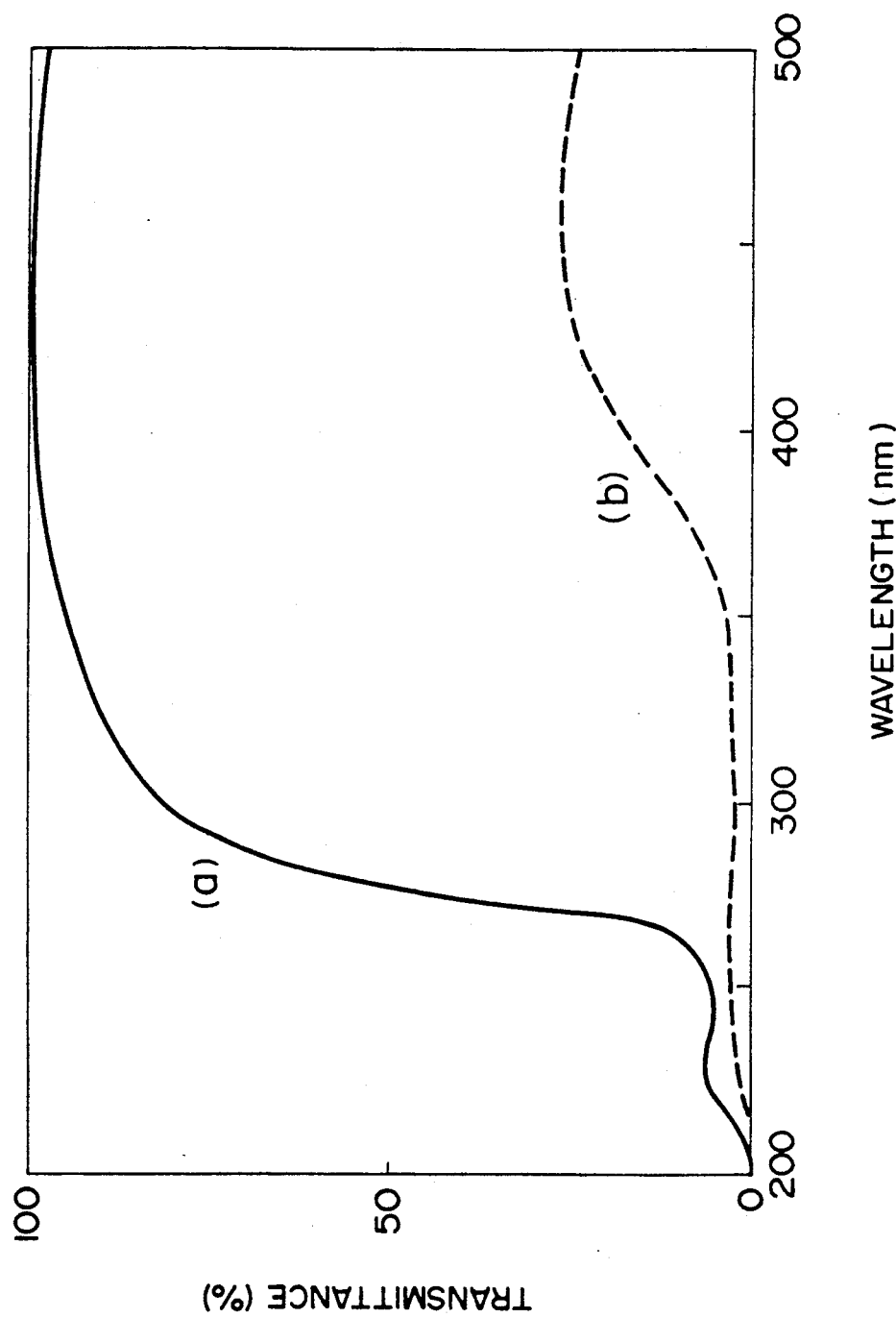

The surface exposed patterned layer was dyed by Ciba Chlorane Blue 8G (made by CIBA-GEIGY) at pH 8.6° and 80° C. in 10 minutes to form a dyed layer 30 as shown in FIG. 3. The ratio of the transmittance of a dyed portion to that of an undyed portion was 1/10 at a wavelength of 365 nm. In FIG. 6, there are shown the transmittance spectrum of the resist before the exposure (a) and that of the resist dyed after exposed at a dose of 100 mJ/cm².

Figure 4:
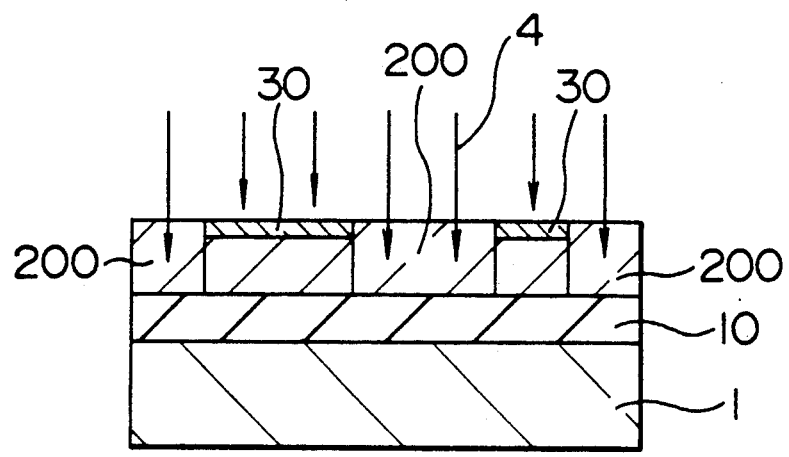

As shown in FIG. 4, the resulting organic thin film was irradiated all over the surface with i-line of a super high pressure mercury lamp having a wavelength of 365 nm. Thereby, only the undyed portion 200 of the organic thin film 2 was selectively exposed since the second energy beam 4 (i-line) was absorbed by the dyed layer 30, so that the light could not reach the lower portion thereunder.

Figure 5:
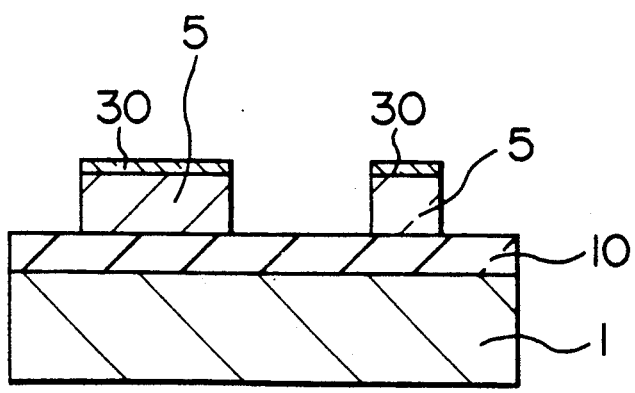

Only the undyed portion 200 was removed by developing the organic thin film with an alkaline resist developer. As a result, as shown in FIG. 5, a high resolution resist pattern 5 was obtained which had line and space of 0.5 μm in width and reversed a mask pattern in the same way as in an IR method.

EXAMPLE 2

The same procedure was repeated as in Example 1, except that there was used the base polymer the repeating unit of which was represented by the following formula:

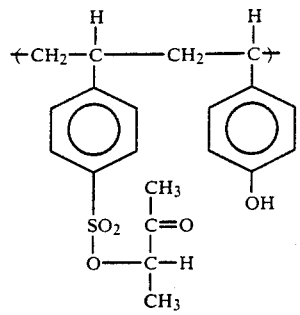

and the surface exposed patterned layer was dyed by Fuchsin at pH 9 and 80° C. at a dose of 150 mJ/cm².

The same results were obtained as in Example 1.

What is claimed is:

1. A process for forming a fine resist pattern which comprises forming an organic thin film by coating a substrate with a resist comprising, as a base polymer, a polymer to which there is chemically bonded a functional group which is converted into amino group or sulfonic acid group responding to a first energy beam; forming a surface exposed patterned layer at the vicinity of the surface of the organic thin film by selectively exposing said surface to said first energy beam; selectively staining said surface exposed patterned layer with a substance which absorbs a second energy beam; exposing the entire surface of said organic thin film to said second energy beam and forming a resist pattern by developing the organic thin film exposed to said second energy beam.

2. A process for forming a fine resist pattern according to claim 1, wherein the functional group is represented by the formula:

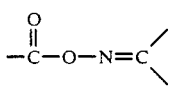

3. A process for forming a fine resist pattern according to claim 1, wherein the functional group is represented by the formula:

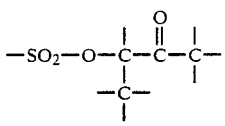

4. A process for forming a fine resist pattern according to claim 1, wherein the first energy beam and the second energy beam are ultraviolet lights.

5. A process for forming a fine resist pattern according to claim 1, wherein the wavelength of the first energy beam is shorter than that of the second energy beam.

6. A process for forming a fine resist pattern according to claim 1, wherein the first energy beam is a deep ultraviolet excimer laser light.

7. A process for forming a fine resist pattern according to claim 2, wherein the substance which absorbs the second energy beam is a dyestuff.

8. A process for forming a fine resist pattern according to claim 3, wherein the substance which absorbs the second energy beam is a dyestuff.

* * * * *